(12) United States Patent
Yamada et al.

(10) Patent No.: US 8,658,436 B2
(45) Date of Patent: Feb. 25, 2014

(54) METHOD FOR SEPARATING AND TRANSFERRING IC CHIPS

(75) Inventors: Masahiro Yamada, Boise, ID (US); Kenya Iwasaki, Tokyo (JP); Hiroshi Nishikawa, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 325 days.

(21) Appl. No.: 13/089,619

(22) Filed: Apr. 19, 2011

(65) Prior Publication Data

US 2011/0281377 A1    Nov. 17, 2011

Related U.S. Application Data

(60) Provisional application No. 61/325,619, filed on Apr. 19, 2010.

(51) Int. Cl.
*H01L 21/78* (2006.01)
*H01L 21/66* (2006.01)

(52) U.S. Cl.
USPC ............. 438/10; 438/460; 438/462; 438/464; 257/E21.531; 257/E21.599

(58) Field of Classification Search
USPC ........................................................ 438/462
See application file for complete search history.

(56) References Cited

U.S. PATENT DOCUMENTS

| | | | | |
|---|---|---|---|---|
| 6,528,864 | B1* | 3/2003 | Arai | 257/620 |
| 6,713,843 | B2* | 3/2004 | Fu | 257/620 |
| 8,093,090 | B1* | 1/2012 | Pio | 438/63 |
| 2005/0158967 | A1* | 7/2005 | Huang et al. | 438/460 |
| 2007/0054476 | A1* | 3/2007 | Nakahata et al. | 438/483 |
| 2011/0177675 | A1* | 7/2011 | Grivna et al. | 438/462 |

FOREIGN PATENT DOCUMENTS

| | | |
|---|---|---|
| JP | 07-074130 A | 3/1995 |
| JP | 2001-148358 A | 5/2001 |

\* cited by examiner

*Primary Examiner* — Angel Roman
(74) *Attorney, Agent, or Firm* — Pearne & Gordon LLP

(57) ABSTRACT

[Problems] There are provided a chip separation method and a chip transfer method using features of dry etching.
[Means for Solving the Problems] In the chip separation method, a multiple number of semiconductor devices or semiconductor integrated circuits are separated from a wafer 100 on which the multiple number of semiconductor devices or semiconductor integrated circuits are formed. The method includes forming, on a surface of the wafer 100, a mask layer through which a line-shaped pattern to be removed for separating the semiconductor devices or semiconductor integrated circuits is exposed; and etching the exposed pattern to a depth equal to or larger than about ⅔ of a thickness of the wafer. One group of separated semiconductor devices or semiconductor integrated circuits has a distinguishable shape from another group of separated semiconductor devices or semiconductor integrated circuits.

3 Claims, 13 Drawing Sheets ions are formed and transfer the separated semiconductor integrated circuit chips. By way of example, described in Patent Document 1 is a method for separating integrated circuit chips by performing a so-called trench etching on spaces between the integrated circuit chips by using a dry etching method. Further, described in Patent Document 2 is a chip separation method by which it is possible to divide a wafer by an etching process even in case that chips having irregular shapes when viewed from the top are formed on the wafer.
METHOD FOR SEPARATING AND TRANSFERRING IC CHIPS

CROSS-REFERENCE TO RELATED APPLICATION

This Application claims the benefit of U.S. Provisional Application Ser. No. 61/325,619 filed on Apr. 19, 2010, the entire disclosures of which are incorporated herein by reference.

TECHNICAL FIELD

The present disclosure relates to a method for separating and transferring, on a semiconductor integrated circuit (IC) chip unit, a semiconductor wafer on which semiconductor integrated circuits are formed.

BACKGROUND ART

Various methods have been proposed to separate a semiconductor wafer on which semiconductor integrated circuits are formed and transfer the separated semiconductor integrated circuit chips. By way of example, described in Patent Document 1 is a method for separating integrated circuit chips by performing a so-called trench etching on spaces between the integrated circuit chips by using a dry etching method. Further, described in Patent Document 2 is a chip separation method by which it is possible to divide a wafer by an etching process even in case that chips having irregular shapes when viewed from the top are formed on the wafer.

REFERENCES

Patent Document 1: Japanese Patent Laid-open Publication No. H07-74130
Patent Document 2: Japanese Patent Laid-open Publication No. 2001-148358

DISCLOSURE OF THE INVENTION

Problems to be Solved by the Invention

In this regard, the present disclosure provides a chip separation method and a chip transfer method using features of dry etching and thus having various features which was difficult to achieve by conventional methods.

Means for Solving the Problems

To solve the above-mentioned problems, in accordance with one aspect of the present disclosure, there is provided a method for separating a multiple number of semiconductor devices or semiconductor integrated circuits from a wafer on which the multiple number of semiconductor devices or semiconductor integrated circuits are formed. The separation method includes forming, on a surface of the wafer, a mask layer through which a line-shaped pattern to be removed for separating the semiconductor devices or semiconductor integrated circuits is exposed; and etching the exposed pattern to a depth equal to or larger than about ⅔ of a thickness of the wafer. Herein, one group of separated semiconductor devices or semiconductor integrated circuits has a distinguishable shape from another group of separated semiconductor devices or semiconductor integrated circuits.

The line-shaped pattern may include a pattern besides a lattice line pattern used for separating the semiconductor devices or semiconductor integrated circuits, thus allowing each of the separated semiconductor devices or semiconductor integrated circuits to have the distinguishable shape.

The distinguishable shape may be used for classifying the semiconductor device or semiconductor integrated circuit into a fine product and a defective product according to a result of an electrical test.

The fine product may have a shape cut along a lattice line pattern, whereas the defective product may have a shape cut along a pattern besides the lattice line pattern.

Further, to solve the above-mentioned problems, in accordance with another aspect of the present disclosure, there is provided a method for separating a multiple number of semiconductor devices or semiconductor integrated circuits from a wafer on which the multiple number of semiconductor devices or semiconductor integrated circuits are formed. The separation method includes forming, on a surface of the wafer, a mask layer through which a line-shaped pattern to be removed for separating the semiconductor devices or semiconductor integrated circuits is exposed; and etching the exposed pattern to a depth equal to or larger than about ⅔ of a thickness of the wafer. Herein, the line-shaped pattern is formed so as to prevent a test device formed on a gap between the semiconductor devices or semiconductor integrated circuits from remaining on separated semiconductor devices or semiconductor integrated circuits.

The line-shaped pattern may include a closed line that encloses the test device.

Furthermore, to solve the above-mentioned problems, in accordance with still another aspect of the present disclosure, there is provided a method for separating a multiple number of semiconductor devices or semiconductor integrated circuits from a wafer on which the multiple number of semiconductor devices or semiconductor integrated circuits are formed. The separation method includes forming, on a surface of the wafer, a mask layer through which a line-shaped pattern to be removed for separating the semiconductor devices or semiconductor integrated circuits is exposed; etching the exposed pattern until the semiconductor devices or semiconductor integrated circuits become separable; and transferring separated semiconductor devices or semiconductor integrated circuits by a flow of a fluid.

Furthermore, to solve the above-mentioned problems, in accordance with still another aspect of the present disclosure, there is provided a method for separating a multiple number of semiconductor devices or semiconductor integrated circuits from a wafer on which the multiple number of semiconductor devices or semiconductor integrated circuits are formed. The separation method includes forming, on a surface of the wafer, a mask layer through which a line-shaped pattern to be removed for separating the semiconductor devices or semiconductor integrated circuits is exposed; mounting the wafer on a stage; etching the exposed pattern until the semiconductor devices or semiconductor integrated circuits become separable; and transferring separated semiconductor devices or semiconductor integrated circuits into a collecting member provided in the vicinity of the stage by inclining the stage.

Furthermore, to solve the above-mentioned problems, in accordance with still another aspect of the present disclosure, there is provided a method for separating semiconductor devices or semiconductor integrated circuits. The separation method includes attaching a wafer on a flexible sheet provided in a circular ring-shaped rigid frame; performing a trench etching process to a depth before chips are completely separated on a stage; transferring the frame to or to the vicinity of a unit for performing a next process; and breaking a planar state of the flexible sheet, thus breaking a remaining substrate layer connecting the chips and completing separation of the chips.

Furthermore, to solve the above-mentioned problems, in accordance with still another aspect of the present disclosure, there is provided a method for separating semiconductor devices or semiconductor integrated circuits. The separation method includes attaching a wafer on a flexible sheet provided in a circular ring-shaped rigid frame; performing a trench etching process to a depth before chips are completely separated on a stage; transferring the frame to or to the vicinity of a unit for performing a next process; and applying a mechanical/thermal impact, thus breaking a remaining silicon layer connecting the chips and completing separation of the chips.

Furthermore, to solve the above-mentioned problems, in accordance with still another aspect of the present disclosure, there is provided a method for separating semiconductor devices or semiconductor integrated circuits. The separation method includes mounting a wafer on a stage via a tray or a plate which is not secured to the stage within a chamber; performing a trench etching process to a depth at which chips are completely separated; and transferring the tray or the plate to or to the vicinity of a unit for performing a next process.

The wafer may be secured on the tray or the plate by an adhesive layer and the adhesive layer may be changeable into a solid phase or a liquid phase depending on a temperature.

Furthermore, to solve the above-mentioned problems, in accordance with still another aspect of the present disclosure, there is provided a method for separating a multiple number of semiconductor devices or semiconductor integrated circuits from a wafer on which the multiple number of semiconductor devices or semiconductor integrated circuits are formed. The separation method includes attaching a wafer to a transfer sheet via a thermoplastic resin; forming, on a surface of the wafer, a mask layer through which a line-shaped pattern to be removed for separating the semiconductor devices or semiconductor integrated circuits is exposed; etching the wafer, the resin and the transfer sheet by using the mask layer as a mask and separating the semiconductor devices or semiconductor integrated circuits; melting the resin into a liquid phase by heating the resin; and cooling the resin in the liquid phase to harden the resin, thereby connecting separated transfer sheets to each other.

The multiple number of semiconductor devices or semiconductor integrated circuits formed on the wafer may have same shapes.

A shape of the semiconductor device or semiconductor integrated circuit may be adjusted such that a bonding pad on the separated semiconductor device or semiconductor integrated circuit is located close to an outgoing terminal connected to the bonding pad via a bonding wire.

Furthermore, to solve the above-mentioned problems, in accordance with still another aspect of the present disclosure, there is provided a method for separating a multiple number of semiconductor devices or semiconductor integrated circuits from a wafer on which the multiple number of semiconductor devices or semiconductor integrated circuits are formed. The separation method includes attaching a wafer to a transfer sheet via a thermoplastic resin; forming, on a surface of the wafer, a mask layer through which a line-shaped pattern to be removed for separating the semiconductor devices or semiconductor integrated circuits is exposed; etching the wafer by using the mask layer as a mask; heating the resin and melting the resin into a liquid phase to thereby prevent the resin from being etched; and cooling the resin to harden the resin in the liquid phase.

The separation method may further include etching the resin between etching the wafer and melting the resin into the liquid phase.

The separation method may further include etching the resin and a part of the transfer sheet between etching the wafer and melting the resin into the liquid phase.

The multiple number of semiconductor devices or semiconductor integrated circuits may have same shapes.

A shape of the semiconductor device or semiconductor integrated circuit may be adjusted such that a bonding pad on the separated semiconductor device or semiconductor integrated circuit is located close to on outgoing terminal connected to the bonding pad via a bonding wire.

Effect of the Invention

As described above, in accordance with the present disclosure, it is possible to provide a chip separation method and a chip transfer method having various features which was difficult to achieve by conventional methods.

MODE FOR CARRYING OUT THE INVENTION

Figure 1A:
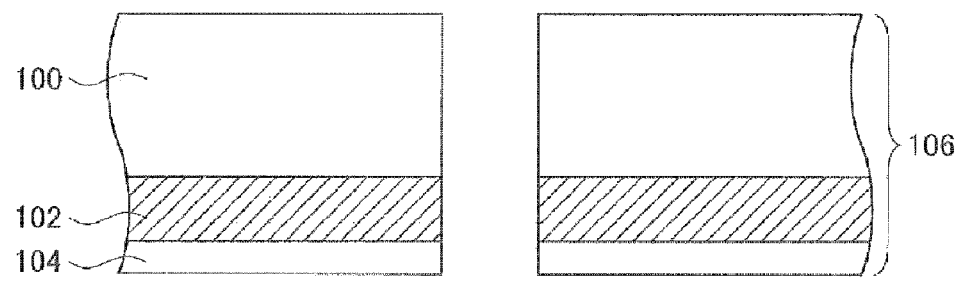
FIG. 1A is a diagram for describing an example of using a thermoplastic resin between a wafer and a transfer sheet in a chip separation method in accordance with an embodiment of the present disclosure.
Figure 1B:
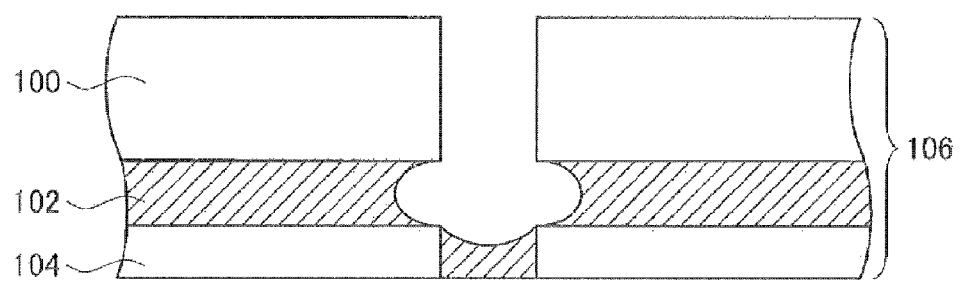
FIG. 1B is a diagram for describing a modification example of using a thermoplastic resin between the wafer and the transfer sheet in the chip separation method in accordance with the embodiment of the present disclosure.

Hereinafter, non-limiting embodiments of the present disclosure will be described in detail with reference to the accompanying drawings. Through the whole document, parts having substantially the same function and configuration will be assigned same reference numerals and redundant description thereof will be omitted.

Below, a method for separating and transferring integrated circuit chips on a semiconductor wafer in accordance with an embodiment of the present disclosure will be explained. After the respective chips are formed on the semiconductor wafer and electrical inspection for the respective chips are completed, a mask pattern is formed on a surface of the semiconductor wafer.

The mask pattern may be formed by either one of the following methods. First, a so-called lithography technique may be used. In the lithography technique, a photoresist layer is formed on the surface of the semiconductor wafer, and a mask layer, which allows an etching target area to be exposed therethrough, is formed by performing an exposure/developing process of a preset mask pattern. Alternatively, same patterns may be printed on the surface of the semiconductor wafer by using a printing technique. Since dimensional accuracy required for forming etching patterns for separating the chips is lower than that required for forming an integrated circuit itself, a desired pattern can be formed by using a relatively low-cost printing technique such as inkjet printing.

Then, the mask layer is formed on the semiconductor wafer by either one of the aforementioned methods and exposed silicon on the surface of the semiconductor wafer is etched in a depth direction (in a thickness direction of a chip toward a rear surface thereof) by a well-known plasma dry etching method.

Unlike cutting and separation by a dicing saw (grinding wheel), a pattern of a cutting line need not necessarily have a straight lattice line shape if the chips are separated by trench etching. An inventive method using this characteristic is provided as follows.

First, in accordance with one aspect of the present disclosure, there is provided a method for separating a multiple number of semiconductor devices or semiconductor integrated circuits from a wafer on which the multiple number of semiconductor devices or semiconductor integrated circuits are formed. The method includes forming, on a surface of the wafer, a mask layer through which a line-shaped pattern to be removed for separating the semiconductor devices or semiconductor integrated circuits is exposed; and etching the exposed pattern to a depth equal to or larger than about 2/3 of a thickness of the wafer. The line-shaped pattern includes a pattern besides a straight lattice line pattern used for separating the semiconductor devices or semiconductor integrated circuits, thus allowing each of the separated semiconductor devices or semiconductor integrated circuits to have the distinguishable shape. The distinguishable shape is used for classifying the semiconductor device or semiconductor integrated circuit into a fine product and a defective product according to a result of an electrical test.

By way of example, when a result of an electrical inspection of the device or the integrated circuit is 'fine product', a periphery of the device or the integrated circuit may have a typical rectangular shape when viewed from the top after the device or integrated circuit is separated, whereas when a result of an electric inspection of the device or the integrated circuit is 'defective product', a periphery of the device or the integrated circuit may have a partially broken rectangular shape having a defect after the device or the integrated circuit is separated.

In this way, the device or the integrated circuit can be classified into the fine product or the defective product based on the above-mentioned shape formed according to the result of the electrical inspection. Accordingly, the fine product or the defective product of the device or integrated circuit can be determined by an optical method or a fitting state of the device or integrated circuit to a jig having a certain shape. Furthermore, the defective products can be further classified into multi-classes depending on a shape or a position of a 'defect' that each product has.

In accordance with another aspect of the present disclosure, there is provided a method for separating a multiple number of semiconductor devices or semiconductor integrated circuits from a wafer on which the multiple number of semiconductor devices or semiconductor integrated circuits are formed. The method includes forming, on a surface of the wafer, a mask layer through which a line-shaped pattern to be removed for separating the semiconductor devices or semiconductor integrated circuits is exposed; and etching the exposed pattern to a depth equal to or larger than about 2/3 of a thickness of the wafer. Herein, the line-shaped pattern includes a pattern besides a straight lattice line pattern used for separating the semiconductor devices or semiconductor integrated circuits. Further, the line-shaped pattern is formed so as to prevent a test device formed on a gap between the semiconductor devices or semiconductor integrated circuits from remaining on separated semiconductor devices or semiconductor integrated circuits.

In a manufacturing process of the semiconductor integrated circuit, in addition to an integrated circuit (chips) as an actual product, a test device (TEG) may also be formed on a space (gap) between chips in order to measure and observe a certain electrical characteristic or a processed shape more precisely during or after the manufacturing process. If a wafer having this test device formed thereon is cut by a conventional method using a dicing saw (grinding wheel), the test device may be cut almost in the middle of it and, thus, both parts of the test device may sometimes remain on outermost peripheries of product chips. Thus, a third party such as a customer can observe and analyze a pattern of the TEG. In such a case, knowhow of the TEG would be leaked. In accordance with the present disclosure, however, when etching is performed, a rectangular or circular ring-shaped trench pattern enclosing each TEG can be formed in addition to a trench pattern for separating the integrated circuits (chips) as the actual products. Thus, each TEG can be completely separated from the product chips and cannot be released to the outside of the company. Therefore, knowhow leaks can be prevented.

As an inventive method for transferring completely separated or almost separated chips to a next process such as a die bonding process, the following method can be additionally provided in accordance with an embodiment of the present disclosure.

(1) When performing an etching process on a wafer for the whole thickness thereof until chips are completely separated on a stage or a lower electrode on which the wafer is mounted in an etching chamber:

(Method A)

A wafer to be processed is not directly mounted on the stage or the lower electrode but mounted on a circular, hexagonal or rectangular tray having a size larger than the wafer and placed on the stage or the mounting table. Etching is performed in this state. Then, after the chips are completely separated, the tray is unloaded from the chamber by a mechanical transfer device such as a transfer arm and transferred to an interface of an apparatus for performing a next process.

Further, the wafer and the tray may be temporarily secured to each other by an adhesive layer (fixing layer). A material capable of changing into a solid phase or a liquid phase depending on a temperature may be used for the adhesive layer. Such a material may be paraffin, a certain kind of liquid crystal, a polymer plastic material, or the like.

If a trench etching process is performed at a temperature range in which the adhesive layer is a solid phase, the chips are not separated from the tray even if the etching is performed until the chips are completely separated because bottom surfaces of the chips are secured to the tray by the adhesive layer. Then, after the tray is transferred to a chip collecting device, if the temperature is raised to a range at which the adhesive layer becomes a liquid phase, the chips may be easily separated from the tray and collected.

Now, there will be explained an example of using a thermoplastic resin as an adhesive layer sandwiched or coated between the wafer and the tray (transfer sheet).

(A-1) Typically, when the wafer is divided by etching, if the etching is performed to the wafer and a bottom portion of the transfer sheet, the chips may be completely separated and it becomes difficult to transfer the chips. For the reason, the etching needs to be stopped just before a top surface of the transfer sheet is etched. For the purpose, an end point of the etching needs to be detected. However, in order to detect the end point for stopping the etching process just before the top surface of the sheet is etched, high accuracy of a several micrometer (μm) level is required. As an alternative, a thermoplastic resin may be inserted between the sheet and the wafer (first example).

First, a wafer 100, a thermoplastic resin 102 and a transfer sheet 104 are cut and divided all together by etching (FIG. 1A). Then, separated chips 106 are heated and the resin 102 is melt. At this time, a heating temperature may range from, e.g., about 220° C. to about 250° C., desirably. The melt resin 102 is collected between the chips 106, that is, between a multiple number of separated transfer sheets 104. Thereafter, if the resin 102 is cooled and hardened (solidified), the transfer sheets are connected to each other by the resin 102. That is, although the wafer 100 is divided, the transfer sheet 104 is not divided.

In this way, separation of the chips 106 can be avoided and, thus, the chips 106 can be transferred easily. Further, a temperature for cooling the resin may be in the range of about 60° C. to about 80° C.

(A-2) In the above-described first example, the transfer sheet 104 as well as the wafer 100 and the thermoplastic resin 102 is cut and divided by etching. However, in a second example of inserting a thermoplastic resin between a transfer sheet and a wafer, the transfer sheet is not divided.

Figure 2A:
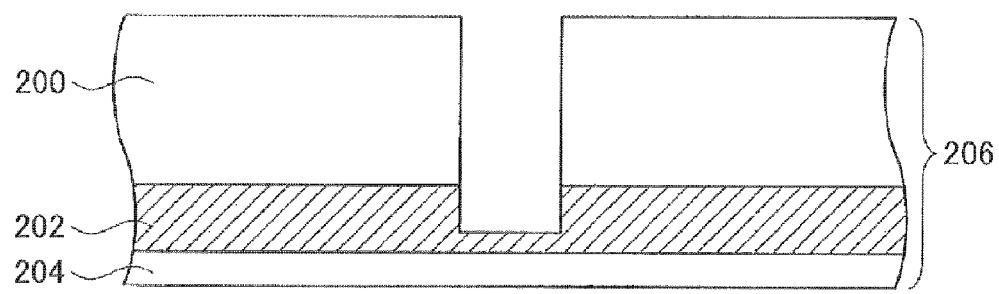
FIG. 2A is a diagram for describing a modification example of using a thermoplastic resin between the wafer and the transfer sheet in the chip separation method in accordance with the embodiment of the present disclosure.
Figure 2B:
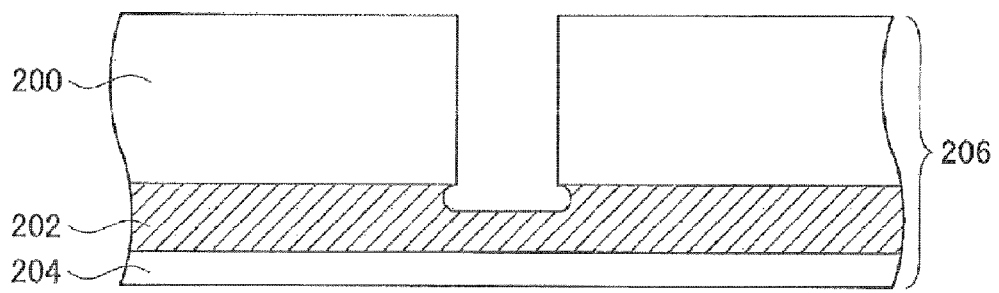
FIG. 2B is a diagram for describing a modification example of using a thermoplastic resin between the wafer and the transfer sheet in the chip separation method in accordance with the embodiment of the present disclosure.

First, a wafer 200 is etched. Then, while etching the thermoplastic resin 202 to a midway position thereof, chips 206 are heated and the resin 202 is melt (FIG. 2A). Desirably, a heating temperature may range from, e.g., about 220° C. to about 250° C. Here, since the resin 202 is in a liquid phase, etching the liquid resin 202 is quite different from etching the solid resin 202. Accordingly, it seems that etching the liquid resin 202 cannot proceed any more. Accordingly, a transfer sheet 204 is not etched. Thereafter, the etching is stopped and the resin is cooled and hardened (FIG. 2B).

As stated above, after the wafer 200 is etched, the resin 202 is liquefied to thereby become a state in which etching no more proceeds. Further, after the etching is stopped, the resin 202 is cooled. Accordingly, while preventing separation of the chips 206 and infliction of damage on the transfer sheet 204 due to the etching, the chips 206 can be transferred easily. Furthermore, if the resin 202 having a certain thickness is heated while it is being etched, the transfer sheet 204 is not etched, and, thus, it becomes unnecessary to detect an etching end point with high precision. Further, a temperature for cooling the resin may be in the range of about 60° C. to about 80° C.

(A-3) In the second example in which the thermoplastic resin is inserted between the transfer sheet and the wafer, the transfer sheet is not divided. In the second example, damage of the transfer sheet 204 can be prevented by heating the resin 202 while the resin 202 is being etched. In accordance with a third example, however, damage of the transfer sheet, if any, can be recovered even if the etching is performed to the transfer sheet.

Figure 3A:
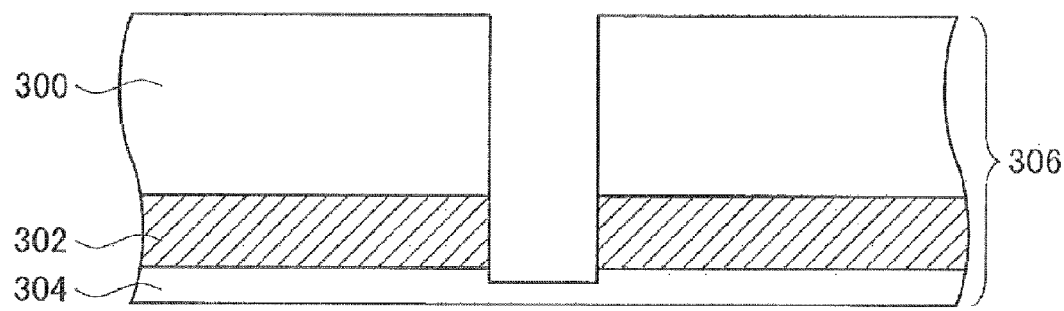
FIG. 3A is a diagram for describing a modification example of using a thermoplastic resin between the wafer and the transfer sheet in the chip separation method in accordance with the embodiment of the present disclosure.
Figure 3B:
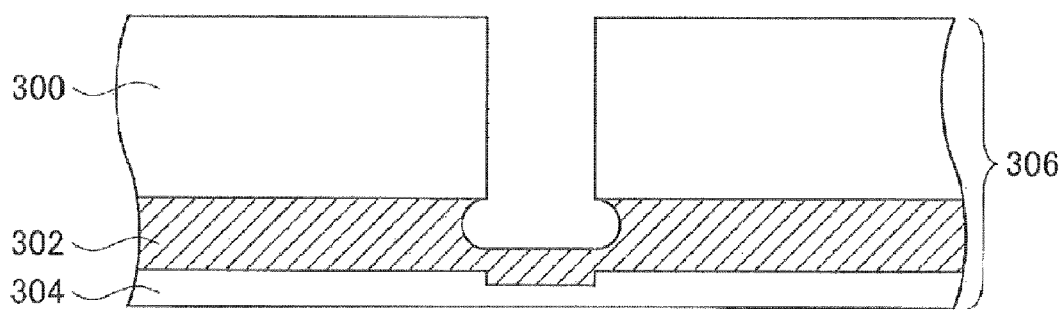
FIG. 3B is a diagram for describing a modification example of using a thermoplastic resin between the wafer and the transfer sheet in the chip separation method in accordance with the embodiment of the present disclosure.

First, a wafer 300, a thermoplastic resin 302 and a part of a transfer sheet 304 are etched (FIG. 3A). Then, chips 306 are heated and the resin 302 is melt. Desirably, a heating temperature may range from, e.g., about 220° C. to about 250° C. The melt resin 302 is collected in an upper portion of the transfer sheet 304. Here, since the resin 302 is in a liquid phase, etching the liquid resin 302 is quite different from etching the solid resin 302. Accordingly, it seems that etching cannot proceed any more. Then, if the etching is stopped and the resin 302 is cooled, the transfer sheet 304 thinned by etching is protected by the resin 302 (FIG. 3B).

As stated above, the resin 302 is liquefied to thereby become a state in which etching no more proceeds and the resin 302 is cooled after the etching is stopped. Thus, even if the transfer sheet 304 is etched, damage of the transfer sheet 304 caused by the etching can be recovered. Accordingly, the chips 306 can be transferred easily. Furthermore, since the damage of the transfer sheet 304 can be recovered by the resin 302, it becomes unnecessary to detect an etching end point with high precision. A temperature for cooling the resin may be in the range of about 60° C. to about 80° C.

In the aforementioned embodiment, there are described examples of inserting the thermoplastic resin between the wafer and the transfer sheet. Quartz or a material having same or equivalent characteristics to those of quartz may be used as a material for the transfer sheet. Even if the upper portion of the transfer sheet 304 is etched, as in the example (A-3), damage of the transfer sheet 304 can be minimized because quartz has a higher selectivity with respect to the wafer (silicon).

Furthermore, the material having same or equivalent characteristics to those of quartz may be prepared by forming a quartz film on a surface of an organic or inorganic substance by sputtering or CVD. Further, $Si_3N_4$, a metal-based thin film or the like may be formed instead of quartz as long as such a film has a higher selectivity with respect to silicon.

Method B

A wafer to be etched is directly mounted on the stage or the lower electrode. Then, etching is performed and chips are separated. A collection vessel (a receptacle, a tray or a box-shaped member) for collecting therein separated chips is provided near and below the stage or the lower electrode. By inclining the stage or the lower electrode toward the collection vessel, the separated chips can be collected into the collection vessel.

Method C

A wafer to be etched is directly mounted on the stage or the lower electrode. Then, etching is performed and chips are separated. A collection vessel (a receptacle, a tray or a box-shaped member) for collecting therein separated chips is provided near and below the stage or the lower electrode. A fluid (gas or liquid) flows from an opposite side of the collection vessel to the collection vessel via separated chip sets, and, thus, the separated chips are collected into the collection vessel by the flow of the fluid. In such a case, a part of the collection vessel such as a bottom thereof may be provided with a multiple number of holes having a size capable of allowing only the fluid to pass therethrough or may be formed in a mesh shape. Desirably, a gas for forming the flow may be, but not limited to, nitrogen which is cost-effective and inert. If a liquid is used, isopropyl alcohol, a Freon solution, or the like may be appropriately used. Alternatively, the separated chips may be collected by being suctioned by a component such as a suction head of a vacuum cleaner. Further, the separated chips may be transferred while being attached to an adhesive sheet.

Method D

In the transfer method using the fluid as described in the method C, in case that a photoresist layer or a temporary protection layer is formed on a chip surface, it may be possible to remove (strip) these layers while transferring the chips if a solvent capable of dissolving these layers is used as the fluid for the transfer. In accordance with this method, during the transfer of the chips, damage of chip surfaces due to contact between the chips can be prevented by the protection layer. Further, by the end of the transfer, the protection layer can be removed completely.

(2) When performing etching on a wafer to a depth just before chips are completely separated on the stage or the lower electrode on which the wafer is mounted in the etching chamber:

(Method A)

A wafer is attached on a flexible sheet such as polyimide provided in a circular ring-shaped rigid frame having an appropriate shape. In this state, etching is performed to a depth just before chips are completely separated on the stage or the lower electrode. In this state, the frame is transferred to or to the vicinity of a unit for performing a next process. Then, by performing a process for breaking the planar state of the sheet, a remaining silicon layer that connects the chips can be broken, so that the chips can be separated.

In order to break the planar state of the sheet:

a center of the sheet may be lifted up mechanically from a rear surface thereof, or the sheet may be lifted such that its front surface protrudes by applying a positive pressure to the rear surface of the sheet or by jetting a gas or a liquid to the rear surface of the sheet.

Method B

A wafer is attached on a flexible sheet such as polyimide provided in a circular ring-shaped rigid frame having an appropriate shape. In this state, etching is performed to a depth just before chips are completely separated on the stage or the lower electrode. In this state, the frame is transferred to or to the vicinity of a unit for performing a next process. Then, by applying a mechanical/thermal impact, a remaining silicon layer that connects the chips can be broken, so that the chips can be separated. The mechanical/thermal impact may be applied by, for example, hitting, a sound wave or an ultrasonic wave, a rapid temperature change, or the like.

In the above, the chip separation method has been described. The chip separation by etching is advantageous in that the chips can be separated easily even if the chips have complicated shapes. In other words, the chips may have any shapes other than a rectangular shape. In this regard, in the following, there will be explained effectiveness of the embodiments of the present disclosure when stacking several chips within a single package in a SiP (System in Package).

Figure 4A:
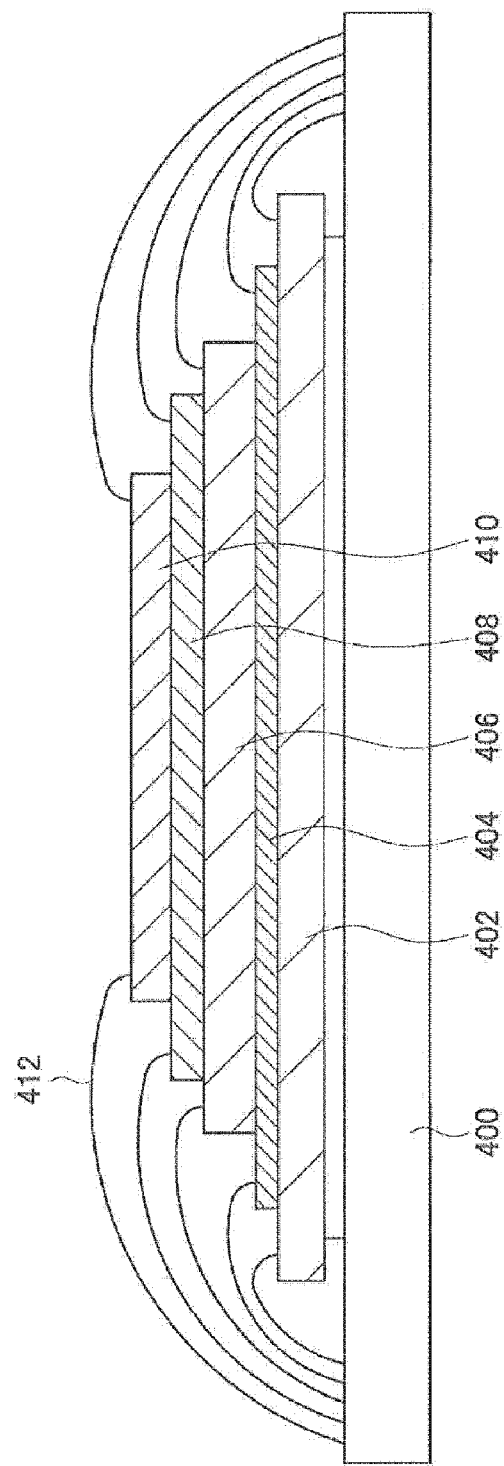
FIG. 4A is a diagram for describing a SiP structure in accordance with a comparative example.

An example of a conventional SiP structure is illustrated in FIG. 4A. Five chips 402, 404, 406, 408 and 410 are stacked on a silicon interposer 400, and the respective chips are connected with the interposer 400 via bonding wires 412. Since the five chips are stacked, heat emitted from the chips cannot be released easily. That is, although heat from the bottommost chip 402 and heat from the topmost chip 410 can be released to spaces above and below the structure relatively easily, heat from the chips 404, 406 and 408 between the chips 402 and 410 may not be released but collected.

Figure 4B:
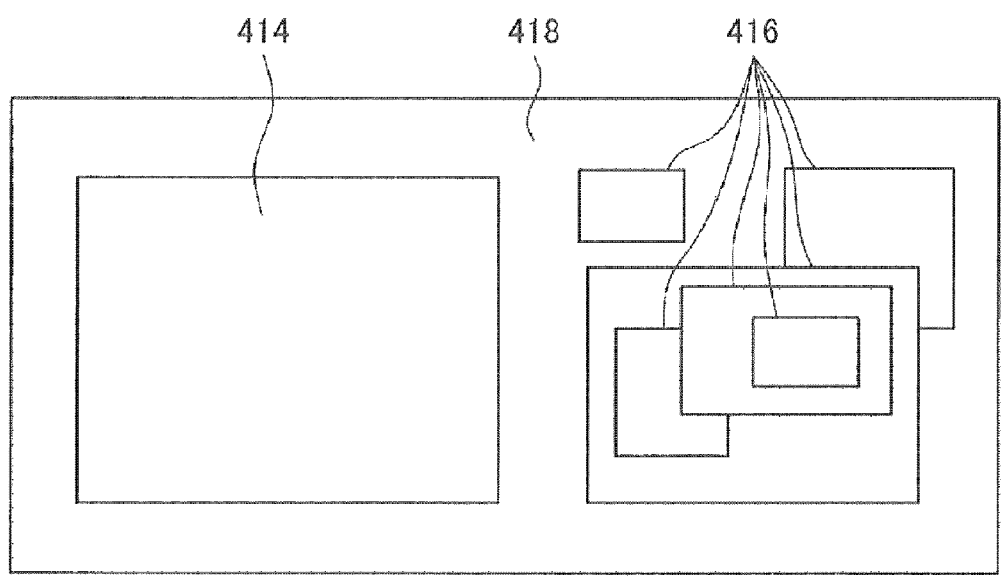
FIG. 4B is a diagram for describing a SiP structure in accordance with a comparative example.

Meanwhile, FIG. 4B is a top view showing another example of the conventional SiP structure. A reference numeral 418 denotes a silicon interposer; and 414, a CPU; 416, a chip such as a SDRAM (Synchronous DRAM), a wireless chip for a mobile device, an LCD driver or an I/O port. In this example, there is an area on which three chips are stacked, and, thus, heat from the chips on this area cannot be easily released out, as in the first example structure.

As a solution, if the chips having desired shapes can be cut by etching as in the above-described embodiments, the degree of freedom in the arrangement of the chips in a single package may be greatly increased. If the chips have rectangular shapes, they need to be stacked in multi-layers, as in the conventional structures. However, by changing the shape of the chips slightly, they may be arranged almost on a same plane. If the chips have non-rectangular shapes, they need not to be stacked on top of each other or the number of stacked chips can be reduced. If the number of stacked chips is reduced to two, such a structure may be very advantageous in the aspect of heat release. Thus, TDP (Thermal Design Power) can be enhanced and the number of chips to be incorporated can be increased, which is advantageous in design of SiP.

Additional merits that can be obtained when the chips having the desired shapes can be cut by etching may be as follows. If rectangular chips are stacked in SiP, space for the arrangement of bonding pads for connecting bonding wires would be limited only to the vicinities of the rectangular chips. Thus, if wires such as gold (Au) or copper (Cu) are connected, a wiring distance may be very long depending on the arrangement.

Figure 5A:
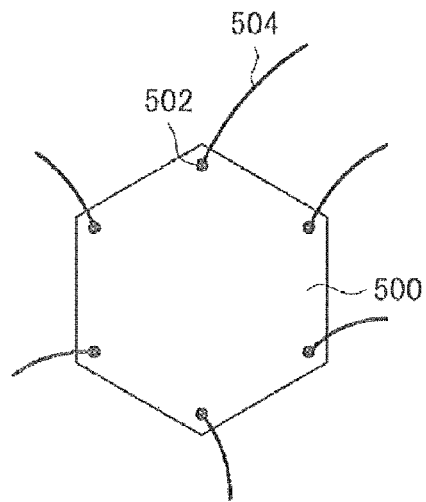
FIG. 5A is a diagram for describing an example of a bonding pad and a bonding wire provided on a non-rectangular chip in accordance with an embodiment of the present disclosure.
Figure 5B:
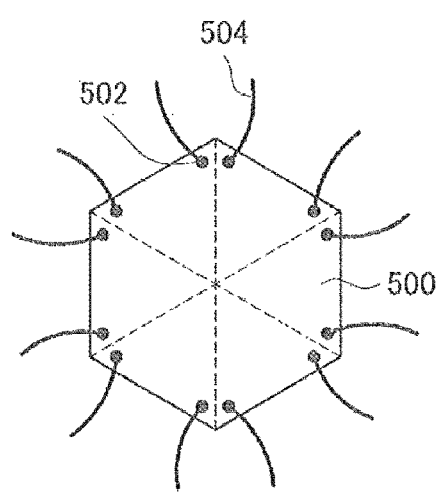
FIG. 5B is a diagram for describing an example of a bonding pad and a bonding wire provided on a non-rectangular chip in accordance with an embodiment of the present disclosure.

In accordance with the embodiments of the present disclosure, if the non-rectangular chips are arranged in SiP, positions of the bonding pads can be selected such that the length of the Au wires can be minimized as compared to a conventional case. Thus, the Au wires for bonding can be connected in a minimum wiring distance. FIGS. 5A and 5B show examples of bonding pads 502 and bonding wires (Au wires) 504 provided on a chip 500 having a non-rectangular shape (a regular hexagonal shape in this example).

That is, when the bonding pads and outgoing terminals of the package are connected, the length of the Au wires can be shortened by selecting a chip shape that allows the bonding pads to be arranged at positions as close to the outgoing terminals as possible. By way of example, among chip shapes as illustrated in FIGS. 6A to 6J to be described later, it may be desirable to select and adjust a chip shape so that the bonding pads can be arranged at positions as close to the outgoing terminals as possible. Usually, since the bonding pads are installed at corners of peripheries of the chip, it may be desirable to select a chip shape having corners closely located to the outgoing terminals.

In the recent economic situation in which gold (Au) is of a very high price, cost-effectiveness can be improved by reducing the length of the Au wires.

Further, as the length of the Au wires is reduced, it is possible to apply a high current. That is, if the length of the Au wires is reduced, a resistance of the Au wires is also reduced and a Joule's heat generated by a current flow can also be reduced. As a result, it becomes possible to apply a high current. In order to further reduce cost of the Au wires when the high current need not be applied, it may be possible to reduce a diameter of the wire since the resistance of the wire is reduced by shortening the wire to the minimum distance.

In the above, it has been described that forming the chips in desired shapes has many advantages in the design of SiP. Meanwhile, when the chips are cut from the wafer, it is required to cut as many chips as possible from a single wafer. If there is a waste of space in cutting the chips, cost-effectiveness may be deteriorated. Thus, desirably, a multiple number of chips formed on the wafer need to have (1) same shapes capable of (2) allowing the chips to be arranged without a waste of space except an area of a minimum groove width for separating the chips by etching. Example shapes are described as follows.

Figure 6A:
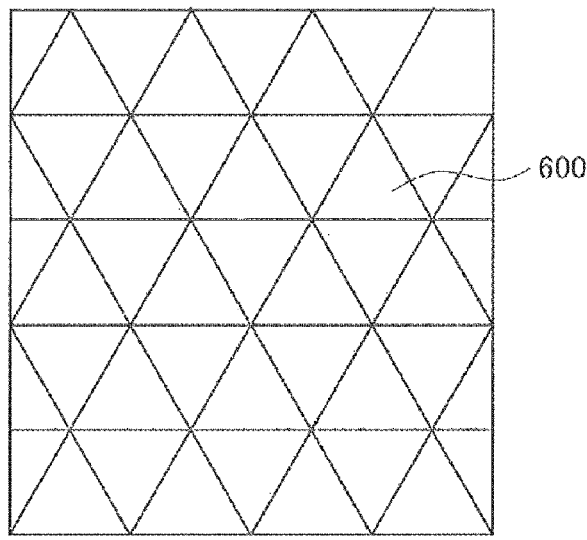
FIG. 6A is a diagram for describing an example of a desirable shape of a chip formed on a wafer in accordance with an embodiment of the present disclosure.

FIG. 6A shows an example in which a chip 600 has a regular triangle shape. In this example, except for an area of a minimum groove width required for separating chips by etching, chips 600 can be arranged on the wafer without a waste of space. Accordingly, manufacturing cost can be cut.

Figure 6B:
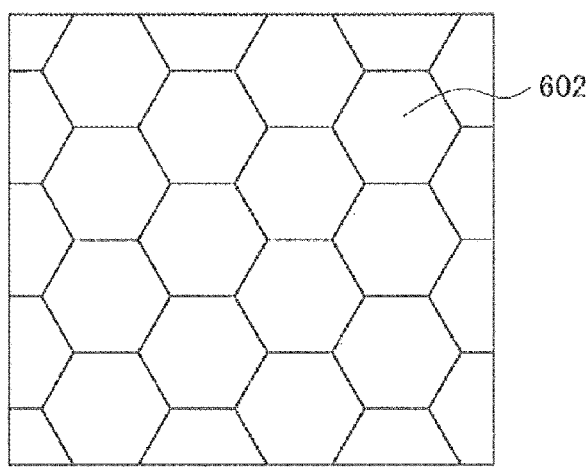
FIG. 6B is a diagram for describing an example of a desirable shape of a chip formed on a wafer in accordance with an embodiment of the present disclosure.

FIG. 6B shows an example in which a chip 602 has a regular hexagon shape. In this example, except for an area of a minimum groove width required for separating chips by etching, chips 602 can be arranged on the wafer without a waste of space. Accordingly, manufacturing cost can be cut.

Figure 6C:
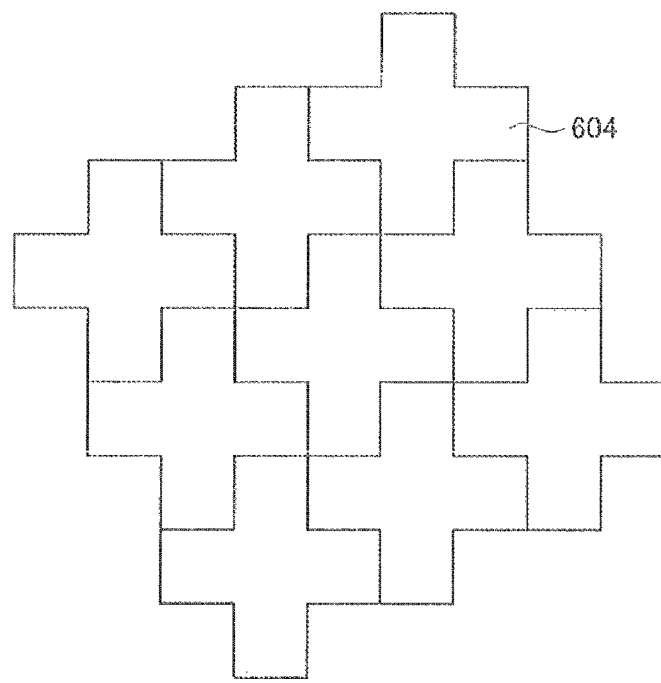
FIG. 6C is a diagram for describing an example of a desirable shape of a chip formed on a wafer in accordance with an embodiment of the present disclosure.

FIG. 6C shows an example in which a chip 604 has a plus sign shape. In this example, except for an area of a minimum groove width required for separating chips by etching, chips 604 can be arranged on the wafer without a waste of space. Accordingly, manufacturing cost can be cut.

Figure 6D:
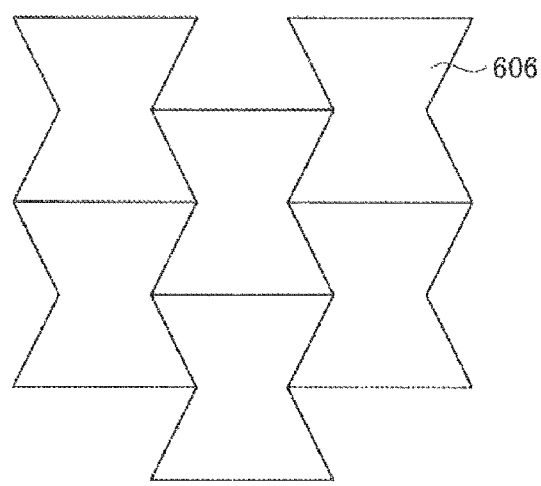
FIG. 6D is a diagram for describing an example of a desirable shape of a chip formed on a wafer in accordance with an embodiment of the present disclosure.

FIG. 6D shows an example in which a recess is formed in a central portion by arranging "Σ" shapes and inverted shapes of the "Σ" shapes to face each other. In this example, except for an area of a minimum groove width required for separating chips by etching, chips 606 can be arranged on the wafer without a waste of space. Accordingly, manufacturing cost can be cut.

Figure 6E:
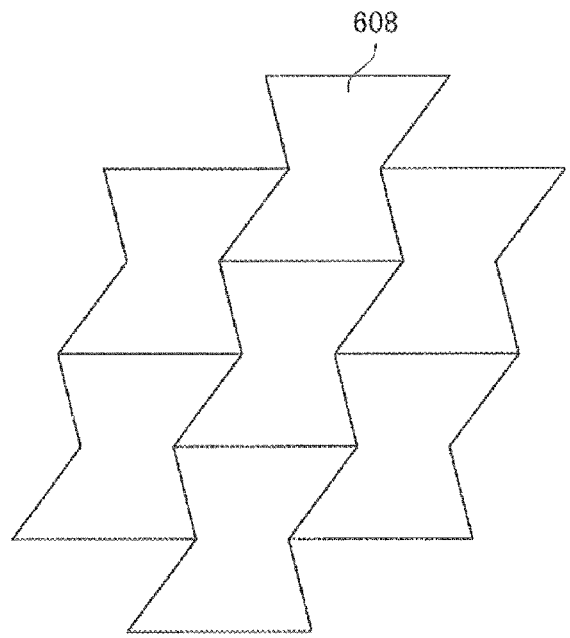
FIG. 6E is a diagram for describing an example of a desirable shape of a chip formed on a wafer in accordance with an embodiment of the present disclosure.

FIG. 6E shows an example in which a chip 608 has a shape obtained by inclining a figure of FIG. 6D to the right. In this example, except for an area of a minimum groove width required for separating chips by etching, chips 608 can be arranged on the wafer without a waste of space. Accordingly, manufacturing cost can be cut.

Figure 6F:
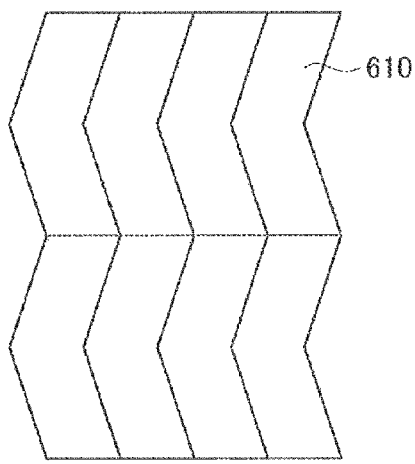
FIG. 6F is a diagram for describing an example of a desirable shape of a chip formed on a wafer in accordance with an embodiment of the present disclosure.

FIG. 6F shows an example in which a chip 610 has a "<" shape. In this example, except for an area of a minimum groove width required for separating chips by etching, chips 610 can be arranged on the wafer without a waste of space. Accordingly, manufacturing cost can be cut. Further, a bending direction may be opposite to that of the "<" shape.

Figure 6G:
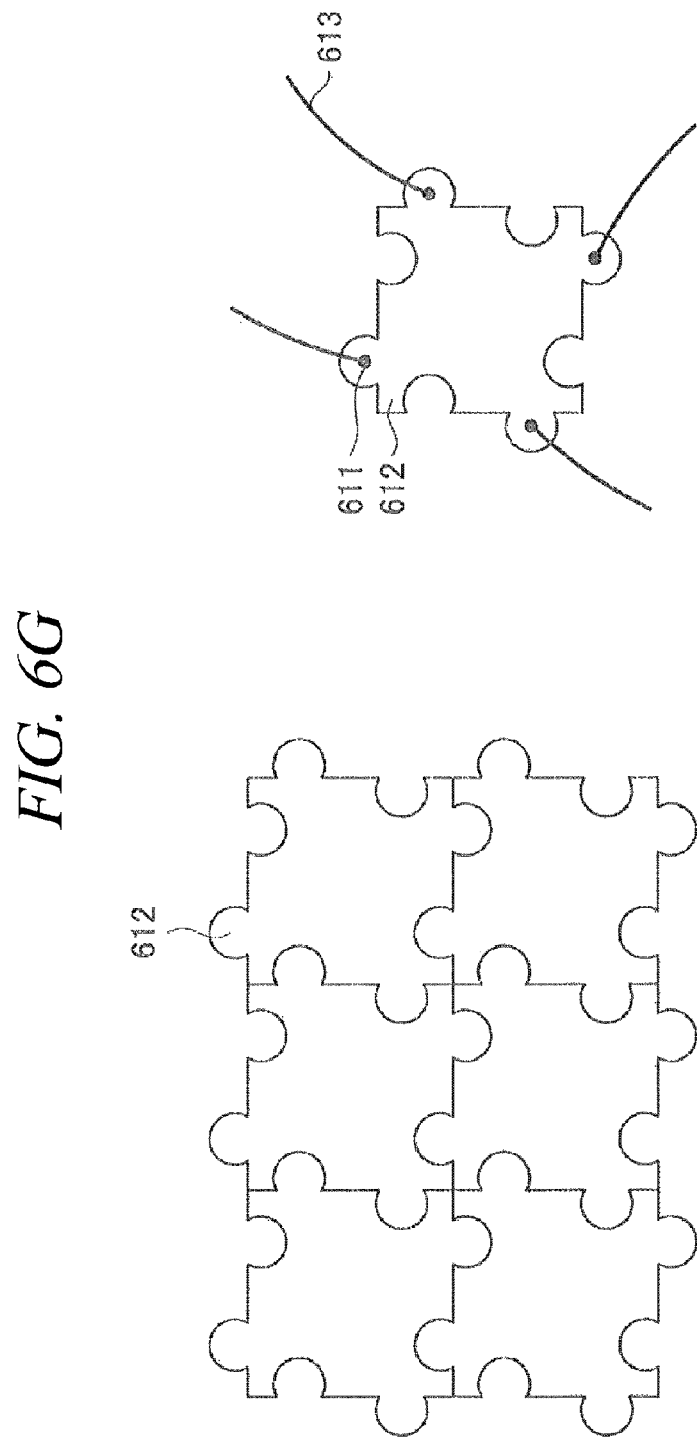
FIG. 6G is a diagram for describing an example of a desirable shape of a chip formed on a wafer in accordance with an embodiment of the present disclosure.

FIG. 6G shows an example in which a chip 612 has a shape obtained by forming semi-circular protrusions/recesses at each side of a square like a jigsaw puzzle. In this example, except for an area of a minimum groove width required for separating chips by etching, chips 612 can be arranged on the wafer without a waste of space. Accordingly, manufacturing cost can be cut. Further, FIG. 6G shows examples of bonding pads 611 and bonding wires (Au wires) 613 provided on the chips 612. With this configuration, the length of the Au wires can be shortened by using the protrusions/recesses of the chips 612.

Figure 6H:
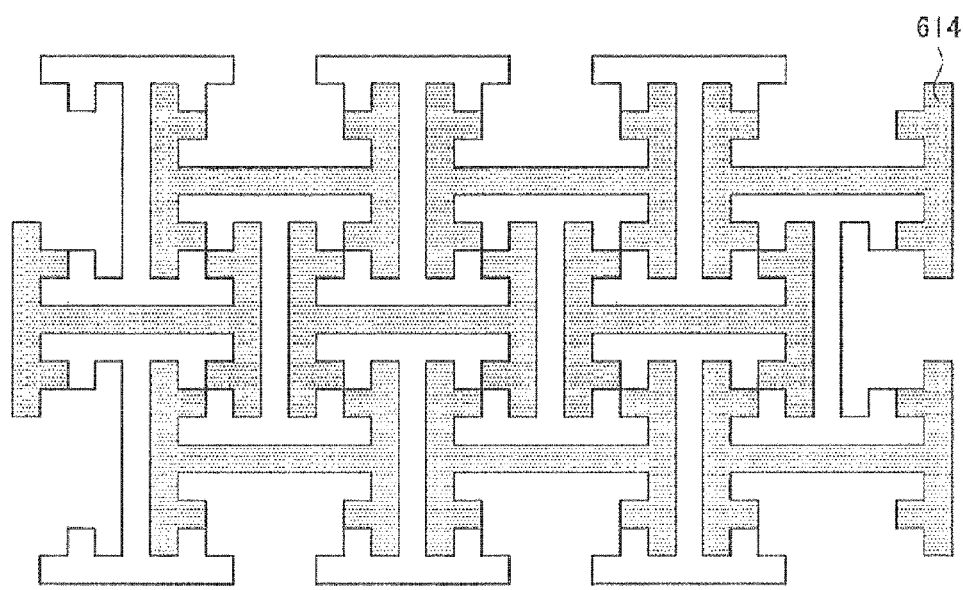
FIG. 6H is a diagram for describing an example of a desirable shape of a chip formed on a wafer in accordance with an embodiment of the present disclosure.

FIG. 6H shows an example in which a chip 614 has a shape similar to an "I" shape. Further, protrusions are formed at two positions of each of an upper horizontal line and a lower horizontal line of the "I" shape so as to face each other symmetrically with respect to a vertical line. In this example, except for an area of a minimum groove width required for separating chips by etching such that a horizontal line of an "I" shape is fitted to a vertical line of an adjacent "I" shape, chips 614 can be arranged on the wafer without a waste of space.

Further, in the above examples, the multiple number of chips formed on the wafer have same shapes. However, the present disclosure may not be limited thereto, and a multiple number of chips having mirror-symmetrical shapes may be formed on the wafer. In this case, the shapes also need to be designed such that chips can be arranged without a waste of space except for an area of a minimum groove width required for separating chips by etching.

Figure 6I:
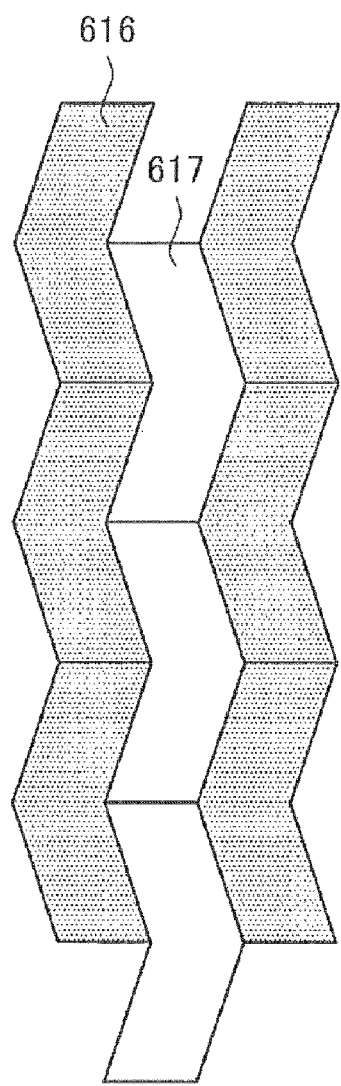
FIG. 6I is a diagram for describing an example of a desirable shape of a chip formed on a wafer in accordance with an embodiment of the present disclosure.

FIG. 6I shows an example in which a chip 616 has a shape in which a "<" shape and an inverted shape of the "<" shape are alternately arranged while being shifted by a half pattern. The chip 616 and a chip 617 have shapes mirror-symmetrical with respect to each other. In this example, except for an area of a minimum groove width required for separating chips by etching, chips 616 and chips 617 can be arranged on the wafer without a waste of space.

Figure 6J:
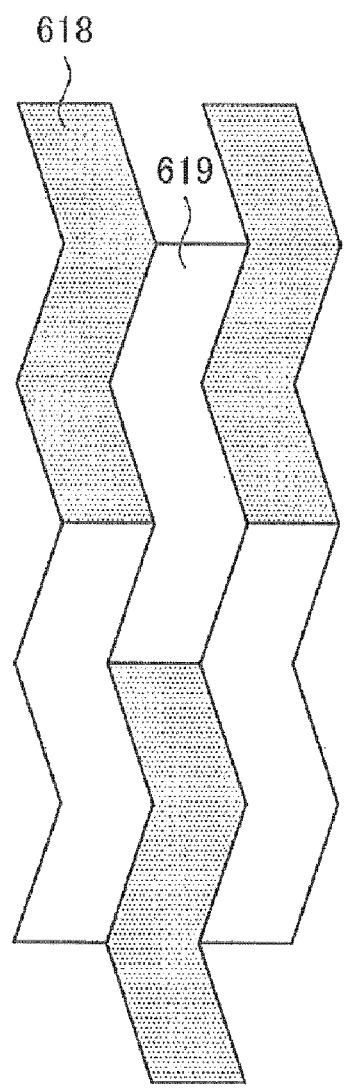
FIG. 6J is a diagram for describing an example of a desirable shape of a chip formed on a wafer in accordance with an embodiment of the present disclosure.

FIG. 6J shows a modification example of FIG. 6I. In this example, a chip 618 is bent at two positions and the chip 618 and a chip 619 have shapes mirror-symmetrical with respect to each other. In this example, except for an area of a minimum groove width required for separating, chips 618 and chips 619 can be arranged on the wafer without a waste of space.

While various aspects and embodiments have been described herein with reference to the accompanying drawings, the present disclosure is not limited thereto. Therefore, the true scope and spirit of the disclosure are indicated by the appended claims rather than by the foregoing description, and it shall be understood that all modifications and embodiments conceived from the meaning and scope of the claims and their equivalents are included in the scope of the disclosure.

By way of example, when cutting the chips in the examples of FIGS. 6B to 6J except FIG. 6A, the chips cannot be cut by a conventionally used dicing saw. The chips of FIGS. 6B to 6J can be cut only by a method of forming a mask layer through which a cutting part is exposed and etching the exposed part. In view of this aspect, advantages of the present disclosure can also be understood.

EXPLANATION OF REFERENCE NUMERALS

100: Wafer
102: Thermoplastic resin
104: Transfer sheet
106: Chip
200: Wafer
202: Thermoplastic resin
204: Transfer sheet
206: Chip
300: Wafer
302: Thermoplastic resin
304: Transfer sheet
306: Chip
400: Silicon interposer
402, 404, 406, 408, 410: Chip
412: Bonding wire
414: CPU
416: Chip
418: Silicon interposer
500: Chip
502: Bonding pad
504: Bonding wire
600, 602, 604, 606, 608, 610, 612, 614: Chip
616~619: Chip

What is claimed is:

1. A method for separating a multiple number of semiconductor devices or semiconductor integrated circuits from a wafer on which the multiple number of semiconductor devices or semiconductor integrated circuits are formed, the method comprising:

performing electrical inspection for each of the semiconductor devices or semiconductor integrated circuits;

determining whether each of the semiconductor devices or semiconductor integrated circuits is a fine product or a defective product based on a result of the electrical inspection;

forming, on a surface of the wafer, a pattern that allows the defective product to have a distinguishable shape from the fine product; and separating each of the semiconductor devices or semiconductor integrated circuits along the pattern formed on the surface of the wafer.

2. The method of claim 1, wherein the fine product has a shape cut along a lattice line pattern, whereas the defective product has a shape cut along a pattern besides the lattice line pattern.

3. The method of claim 1, further comprising:

forming a mask layer through which the pattern is exposed; and etching the exposed pattern to a depth equal to or larger than about $2/3$ of a thickness of the wafer.

* * * * *